(12) United States Patent
Fukumoto et al.

(10) Patent No.: US 12,140,785 B2
(45) Date of Patent: Nov. 12, 2024

(54) WAVELENGTH CONVERSION MEMBER, PRODUCTION METHOD THEREFOR, AND LIGHT-EMITTING DEVICE

(71) Applicant: NIPPON ELECTRIC GLASS CO., LTD., Otsu (JP)

(72) Inventors: Shotaro Fukumoto, Otsu (JP); Shunsuke Fujita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 590 days.

(21) Appl. No.: 17/593,713

(22) PCT Filed: Apr. 6, 2020

(86) PCT No.: PCT/JP2020/015530
§ 371 (c)(1),
(2) Date: Sep. 23, 2021

(87) PCT Pub. No.: WO2020/213456
PCT Pub. Date: Oct. 22, 2020

(65) Prior Publication Data
US 2022/0187519 A1   Jun. 16, 2022

(51) Int. Cl.
*G02B 5/20* (2006.01)
*H01S 5/0225* (2021.01)
*H01S 5/024* (2006.01)

(52) U.S. Cl.
CPC ............ *G02B 5/206* (2013.01); *H01S 5/0225* (2021.01); *H01S 5/02469* (2013.01)

(58) Field of Classification Search
USPC ....................................................... 372/109
See application file for complete search history.

(56) References Cited

U.S. PATENT DOCUMENTS

| 5,998,925 A | 12/1999 | Shimizu et al. |
| 6,069,440 A | 5/2000 | Shimizu et al. |
| 2013/0146918 A1 | 6/2013 | Chen et al. |

(Continued)

FOREIGN PATENT DOCUMENTS

| CN | 103160280 A | 6/2013 |
| CN | 103794704 * | 5/2014 |

(Continued)

OTHER PUBLICATIONS

Official Communication issued in International Patent Application No. PCT/JP2020/015530, mailed on Jun. 16, 2020.

(Continued)

*Primary Examiner* — Tuan N Nguyen
(74) *Attorney, Agent, or Firm* — Keating & Bennett, LLP

(57) ABSTRACT

The purpose is to provide a wavelength conversion member, a method for producing the wavelength conversion member, and a light-emitting device, which are capable of reducing the temperature rise of the wavelength conversion member and thus reducing the decrease in luminescence intensity with time and deformation and discoloration of constituent materials. A wavelength conversion member 10 includes thermally conductive particles 1 and phosphor particles 4 and the thermally conductive particles 1 include two types of thermally conductive particles different in average particle diameter from each other.

16 Claims, 1 Drawing Sheet

(56) References Cited

U.S. PATENT DOCUMENTS

| | | |
|---|---|---|
| 2019/0027656 A1 | 1/2019 | Lee et al. |
| 2019/0194537 A1 | 6/2019 | Sekiguchi et al. |
| 2019/0280166 A1 | 9/2019 | Lee et al. |
| 2019/0341530 A1 | 11/2019 | Okuno et al. |
| 2020/0123063 A1 | 4/2020 | Li et al. |
| 2020/0255729 A1 | 8/2020 | Okuno et al. |
| 2021/0172583 A1 | 6/2021 | Furuyama |
| 2022/0135487 A1 | 5/2022 | Li et al. |

FOREIGN PATENT DOCUMENTS

| | | | |
|---|---|---|---|
| CN | 103794704 A | | 5/2014 |
| CN | 108610023 | * | 2/2018 |
| CN | 108369982 A | | 8/2018 |
| CN | 108610023 A | | 10/2018 |
| CN | 110006005 A | | 7/2019 |
| JP | 2000-208815 A | | 7/2000 |
| JP | 2003-258308 A | | 9/2003 |
| JP | 2011-040715 A | | 2/2011 |
| JP | 4895541 B2 | | 3/2012 |
| JP | 2016-225581 A | | 12/2016 |
| JP | 2018-106176 A | | 7/2018 |
| JP | 2018-109674 A | | 7/2018 |
| JP | 2018-180271 A | | 11/2018 |
| TW | 201831649 A | | 9/2018 |
| TW | 201842154 A | | 12/2018 |
| WO | 2017/098730 A1 | | 6/2017 |
| WO | 2018/123219 A1 | | 7/2018 |
| WO | 2018/189997 A1 | | 10/2018 |

OTHER PUBLICATIONS

Official Communication issued in corresponding Chinese Patent Application No. 202080016901.3, mailed on Mar. 3, 2023.
Official Communication issued in corresponding Taiwanese Patent Application No. 109112930, mailed on May 4, 2023.

* cited by examiner

[FIG. 1]
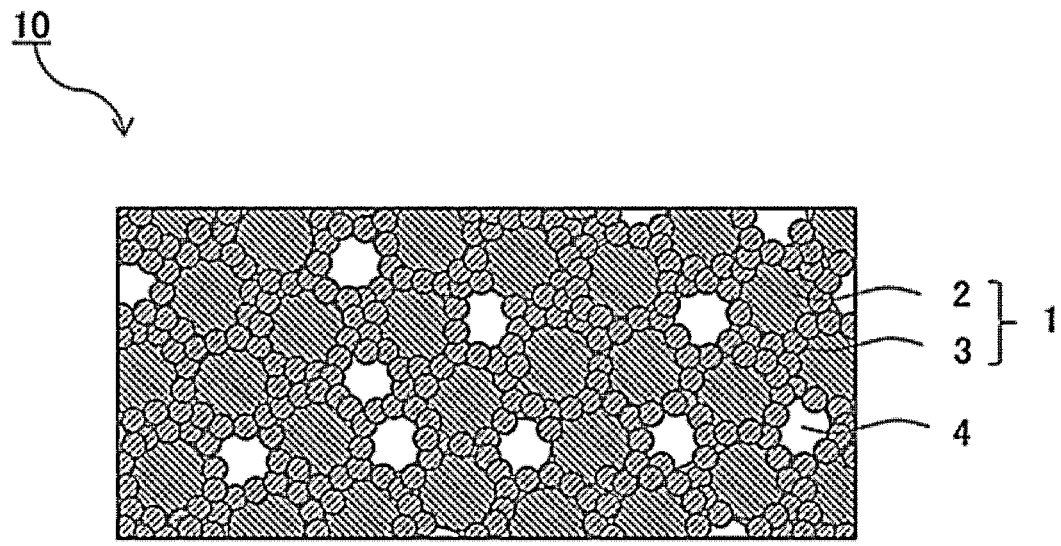
[FIG. 2]
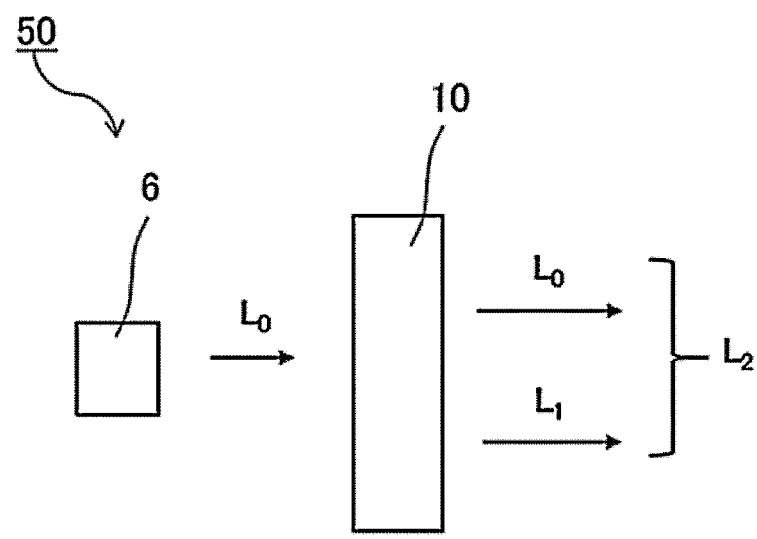

WAVELENGTH CONVERSION MEMBER, PRODUCTION METHOD THEREFOR, AND LIGHT-EMITTING DEVICE

TECHNICAL FIELD

The present invention relates to wavelength conversion members for converting the wavelength of light emitted from light emitting diodes (LEDs), laser diodes (LDs) or the like to another wavelength, methods for producing the wavelength conversion members, and light-emitting devices.

BACKGROUND ART

Attention has been focused on light-emitting devices using LEDs or LDs from the viewpoint of their low power consumption, small size, light weight, and easy adjustment to light intensity. For example, a light-emitting device in which a wavelength conversion member capable of absorbing part of light from an LED is disposed above the LED emits a synthetic light (for example, a white light) of excitation light (for example, a blue light) emitted from the LED and converted light (for example, a yellow light) emitted from the wavelength conversion member. For example, a wavelength conversion member is disclosed in which phosphor particles are dispersed and set in a resin matrix or a glass matrix (Patent Literatures 1 to 3).

CITATION LIST

Patent Literature

[PTL 1]
JP-A-2000-208815
[PTL 2]
JP-A-2003-258308
[PTL 3]
JP-B2-4895541

SUMMARY OF INVENTION

Technical Problem

Recently, with increasing power of light-emitting devices, the intensity of their excitation light is increasing. When a wavelength conversion member is irradiated with high-intensity excitation light, the intensity of heat emitted by the phosphor particles increases, so that the wavelength conversion member is likely to have excessive heat. Such a conventional wavelength conversion member has, due to the above excessive heat, a problem that the luminescence intensity decreases with time (temperature quenching) and a problem that constituent materials are likely to cause deformation, discoloration, and so on.

In view of the foregoing, the present invention has an object of providing a wavelength conversion member, a method for producing the wavelength conversion member, and a light-emitting device, which are capable of reducing the temperature rise of the wavelength conversion member and thus reducing the decrease in luminescence intensity with time and deformation and discoloration of constituent materials.

Solution to Problem

A wavelength conversion member according to the present invention is a wavelength conversion member including thermally conductive particles and phosphor particles, wherein the thermally conductive particles include two types of thermally conductive particles different in average particle diameter from each other.

In the above structure, thermally conductive particles are composed of two types different in average particle diameter from each other. Since different types of thermally conductive particles having different particle diameters are present in the wavelength conversion member, the thermally conductive particles are likely to be densely present in the wavelength conversion member, so that, upon application of excitation light to the wavelength conversion member, heat emitted by the phosphor particles can be easily and efficiently released to the outside. As a result, the decrease in luminescence intensity with time (temperature quenching) and the deformation and discoloration of the constituent materials can be easily reduced.

The wavelength conversion member according to the present invention is preferably a sintered body of the thermally conductive particles and the phosphor particles.

In the wavelength conversion member according to the present invention, it is preferred that the thermally conductive particles include large-diameter thermally conductive particles and small-diameter thermally conductive particles and an average particle diameter D of the large-diameter thermally conductive particles and an average particle diameter d of the small-diameter thermally conductive particles satisfy the following conditions (A) and (B):

$$0.5 \text{ μm} \leq D \leq 50 \text{ μm} \tag{A}$$

$$0.0001 \leq d/D \leq 0.1 \tag{B}$$

In the wavelength conversion member according to the present invention, the average particle diameter D of the large-diameter thermally conductive particles and an average particle diameter $D_P$ of the phosphor particles preferably satisfy the following condition (C):

$$0.1 \leq D_P/D \leq 10 \tag{C}$$

In the wavelength conversion member according to the present invention, a content V of the large-diameter thermally conductive particles and a content $V_P$ of the phosphor particles in the wavelength conversion member preferably satisfy the following condition (D):

$$50\% \leq V_P + V \leq 90\% \tag{D}$$

In the wavelength conversion member according to the present invention, the thermally conductive particles are preferably made of an oxide.

In the wavelength conversion member according to the present invention, the thermally conductive particles are preferably made of magnesium oxide.

In the wavelength conversion member according to the present invention, a content $V_P$ of the phosphor particles is preferably 0.01 to 80% by volume.

A wavelength conversion member according to the present invention is a wavelength conversion member capable of converting a wavelength of excitation light emitted from a light source, wherein a sum of a variation in chromaticity Cx and a variation in chromaticity Cy of all light beams of a synthetic light of the excitation light having passed through the wavelength conversion member and light converted in wavelength from the excitation light and emitted from the wavelength conversion member is 0.03 or less.

A method for producing a wavelength conversion member according to the present invention is a method for producing the above-described wavelength conversion member and includes the step of mixing and firing thermally conductive particles including two types of thermally conductive particles different in average particle diameter from each other and phosphor particles.

In the method for producing a wavelength conversion member according to the present invention, the firing is preferably performed by hot pressing.

In the method for producing a wavelength conversion member according to the present invention, a maximum temperature during the firing is preferably 1300° C. or below.

In the method for producing a wavelength conversion member according to the present invention, the firing is preferably performed in an inert atmosphere, a reductive atmosphere or a vacuum atmosphere.

A light-emitting device according to the present invention includes the above-described wavelength conversion member and a light source operable to irradiate the wavelength conversion member with excitation light.

In the light-emitting device according to the present invention, the light source is preferably a laser diode.

Advantageous Effects of Invention

The present invention enables provision of a wavelength conversion member, a method for producing the wavelength conversion member, and a light-emitting device, which are capable of reducing the temperature rise of the wavelength conversion member and thus reducing the decrease in luminescence intensity with time and deformation and discoloration of constituent materials.

BRIEF DESCRIPTION OF DRAWINGS

FIG. 1 is a schematic cross-sectional view showing an embodiment of a wavelength conversion member according to the present invention.

FIG. 2 is schematic cross-sectional view showing an embodiment of a light-emitting device according to the present invention.

DESCRIPTION OF EMBODIMENTS

Hereinafter, embodiments of the present invention will be described in detail with reference to the drawings. However, the present invention is not at all limited to the following embodiments.

FIG. 1 is a schematic cross-sectional view showing an embodiment of a wavelength conversion member according to the present invention. The wavelength conversion member 10 includes thermally conductive particles 1 and phosphor particles 4. The thermally conductive particles 1 include two types of thermally conductive particles different in average particle diameter from each other, i.e., large-diameter thermally conductive particles 2 and small-diameter thermally conductive particles 3. The small-diameter thermally conductive particles 3 are present between the large-diameter thermally conductive particles 2 and between the large-diameter thermally conductive particles 2 and the phosphor particles 4. Hereinafter, a detailed description will be given of the components.

(Thermally Conductive Particles 1)

The thermally conductive particles 1 are preferably made of an oxide and particularly preferably made of a metallic oxide having high thermal conductivity. Specifically, aluminum oxide, magnesium oxide or zinc oxide is preferred and magnesium oxide is particularly preferred. Among them, magnesium oxide has a high thermal conductivity (45 to 60 $W·m^{-1}·K^{-1}$) and, therefore, can easily and effectively release heat produced in the phosphor particles 4 to the outside. In addition, magnesium oxide less absorbs light in an excitation light wavelength range (for example, 300 to 500 nm) and an emission wavelength range (for example, 380 to 780 nm) of the phosphor particles 4 to be described later and is therefore less likely to decrease the light extraction efficiency of the wavelength conversion member 10. These materials may be used singly or in a mixture of two or more of them.

The thermal conductivity of the thermally conductive particles 1 is preferably 15 $W·m^{-1}·K^{-1}$ or more, more preferably 20 $W·m^{-1}·K^{-1}$ or more, and particularly preferably 30 $W·m^{-1}·K^{-1}$ or more. Thus, heat emitted by the phosphor particles 4 can be easily and effectively released to the outside.

The thermally conductive particles 1 include two types of thermally conductive particles different in average particle diameter from each other. Specifically, the thermally conductive particles 1 include large-diameter thermally conductive particles 2 and small-diameter thermally conductive particles 3. The large-diameter thermally conductive particles 2 and the small-diameter thermally conductive particles 3 are preferably made of the same oxide. For example, when the large-diameter thermally conductive particles 2 are made of magnesium oxide, the small-diameter thermally conductive particles 3 are preferably also made of magnesium oxide. Thus, when the wavelength conversion member 10 is irradiated with excitation light, production of cracks due to a difference in thermal expansion at the interface between the large-diameter thermally conductive particles 2 and the small-diameter thermally conductive particles 3 are less likely to occur. In addition, since there is no difference in refractive index between both types of thermally conductive particles, excessive light scattering generating at the interface between them can be reduced. Furthermore, in producing a wavelength conversion member 10 by firing, both types of thermally conductive particles are bound to each other, so that a wavelength conversion member 10 formed of a dense sintered body can be easily obtained.

The content V of the large-diameter thermally conductive particles 2 in the entire wavelength conversion member 10 is, in terms of % by volume, preferably 0.01 to 80%, more preferably 0.1 to 75%, still more preferably 1 to 70%, even still more preferably 5 to 60%, and particularly preferably 10 to 50%. If the content V is too large, the small-diameter thermally conductive particles 3 are less likely to enter between the large-diameter thermally conductive particles 2 and the phosphor particles 4, so that the wavelength conversion member is difficult to densify. As a result, heat produced in the phosphor particles 4 is difficult to release to the outside. Also if the content V is too small, the heat conductive path formed by the large-diameter thermally conductive particles 2 is reduced, so that heat produced in the phosphor particles 4 is difficult to release to the outside.

The content $V_s$ of the small-diameter thermally conductive particles 3 in the entire wavelength conversion member 10 is, in terms of % by volume, preferably 0.01 to 50%, more preferably 0.1 to 40%, still more preferably 1 to 30%, even still more preferably 5 to 30%, and particularly preferably 10 to 30%. If the content $V_s$ is too large, the distance from the large-diameter thermally conductive particles 2 to the phosphor particles 4 increases, so that heat produced in the phosphor particles 4 is difficult to release to the outside. If the content $V_s$ is too small, the small-diameter thermally conductive particles 3 cannot sufficiently be present in the gaps formed by the large-diameter thermally conductive particles 2 and the phosphor particles 4, so that heat produced in the phosphor particles 4 is difficult to release to the outside.

The average particle diameter D of the large-diameter thermally conductive particles 2 and the average particle diameter d of the small-diameter thermally conductive particles 3 preferably satisfy the conditions (A) and (B) described below. Thus, the large-diameter thermally conductive particles 2 and the small-diameter thermally conductive particles 3 are likely to be present densely relative to each other inside the wavelength conversion member 10, so that heat produced in the phosphor particles 4 can be easily released to the outside. In the present invention, the average particle diameter means a value measured by laser diffractometry and indicates the particle diameter when in a volume-based cumulative particle size distribution curve as determined by laser diffractometry the integrated value of cumulative volume from the smaller particle diameter is 50%. In the present invention, the particle size distribution of each type of particles is regarded as, in principle, having a unimodal distribution profile. Specifically, particles having a bimodal distribution profile are regarded as a mixture of two or more types of unimodal particle size distribution profiles, in which case the particle size distribution is subjected to peak separation and an average particle diameter is calculated for each of the separated distributions.

(Condition A)

The average particle diameter D of the large-diameter thermally conductive particles 2 is preferably 0.5 µm≤D≤50 µm, more preferably 1 µm≤D≤40 µm, still more preferably 3 µm≤D≤30 µm, and particularly preferably 5 µm≤D≤10 µm. If the average particle diameter D is too large, the phosphor particles 4 are likely to be unevenly distributed, so that color unevenness is likely to occur. If the average particle diameter D is too small, the path of heat propagating through the large-diameter thermally conductive particles 2 becomes short, so that a sufficient heat path is difficult to form.

(Condition B)

The particle diameter ratio d/D between the average particle diameter D of the large-diameter thermally conductive particles 2 and the average particle diameter d of the small-diameter thermally conductive particles 3 is preferably 0.0001≤d/D≤0.1, more preferably 0.0005≤d/D≤0.05, and particularly preferably 0.001≤d/D≤0.01. If the particle diameter ratio d/D is too large, the small-diameter thermally conductive particles 3 are difficult to be sufficiently present in the gaps formed by the large-diameter thermally conductive particles 2 and the phosphor particles 4, so that heat produced in the phosphor particles 4 is difficult to release to the outside. If the particle diameter ratio d/D is too small, agglomeration of the small-diameter thermally conductive particles 3 is likely to occur, so that the small-diameter thermally conductive particles 3 are difficult to be sufficiently present in the gaps formed by the large-diameter thermally conductive particles 2 and the phosphor particles 4 and, therefore, heat produced in the phosphor particles 4 is difficult to release to the outside.

(Phosphor Particles 4)

The phosphor particles 4 are preferably inorganic phosphor particles having an excitation band between 300 nm and 500 nm and an emission peak between 380 nm and 780 nm. Examples that can be used include oxide phosphors, nitride phosphors, oxynitride phosphors, chloride phosphors, oxychloride phosphors, halide phosphors, aluminate phosphors, and halophosphoric acid chloride phosphors.

Particularly, oxide phosphors and oxynitride phosphors are preferred because they have high thermal resistance and are therefore less likely to degrade during firing. Specifically, particles of garnet-based ceramic phosphors, including YAG (yttrium-aluminum-garnet) phosphor, or phosphors containing SiAlON as a main component, including α-SiAlON phosphor and β-SiAlON phosphor, are preferably used. Particularly, garnet-based ceramic phosphor particles, including YAG (yttrium-aluminum-garnet) phosphor particles, are preferably used. Depending on the excitation light wavelength range or emission wavelength rage, a plurality of types of phosphor particles 4 may be used in combination.

The average particle diameter $D_P$ of the phosphor particles 4 is preferably 0.1 to 50 µm, more preferably 1 to 30 µm, and particularly preferably 3 to 20 µm. If the average particle diameter $D_P$ is too small, the phosphor particles 4 are likely to agglomerate during production, so that the luminescent color of the wavelength conversion member 10 is likely to be uneven. In addition, the luminous efficiency of the phosphor particles 4 themselves becomes low, so that the brightness of the wavelength conversion member 10 is likely to decrease. Also if the average particle diameter $D_P$ is too large, the luminescent color of the wavelength conversion member 10 is likely to be uneven. LDs have a small spot size of excitation light and are highly directional. Therefore, when the wavelength conversion member 10 is used in a light-emitting device including an LD as a light source, a phenomenon is likely to occur where excitation light passes through the wavelength conversion member 10 without being applied to the phosphor particles 4. Hence, in using the wavelength conversion member 10 for a light-emitting device including an LD as a light source, the average particle diameter of the phosphor particles 4 is preferably not more than 15 µm and particularly preferably not more than 10 µm.

The content $V_P$ of the phosphor particles 4 in the entire wavelength conversion member 10 is, in terms of % by volume, preferably 0.01 to 80%, more preferably 0.1 to 70%, and particularly preferably 1 to 60%. If the content of the phosphor particles 4 is too large, the contents of the large-diameter thermally conductive particles 2 and the small-diameter thermally conductive particles 3 become relatively small, so that heat produced in the phosphor particles 4 is difficult to release to the outside. If the content of the phosphor particles 4 is too small, a desired luminescence intensity is difficult to obtain. In a transmissive wavelength conversion member 10, if the content of phosphor particles 4 is too large, the amount of transmitted excitation light becomes small because of absorption into the phosphor particles 4, so that the chromaticity of the transmitted light is likely to shift to that of fluorescence. As a result, the chromaticity control of the emitted light becomes difficult. Therefore, the content $V_P$ of the phosphor particles in the transmissive wavelength conversion member 10 is preferably 0.01 to 50%, more preferably 0.1 to 35%, and particularly preferably 1 to 20%.

The average particle diameter $D_P$ of the phosphor particles 4 and the average particle diameter D of the large-diameter thermally conductive particles 2 preferably satisfy $0.1 \leq D_P/D \leq 10$, more preferably satisfy $0.5 \leq D_P/D \leq 5$, still more preferably satisfy $1 \leq D_P/D \leq 3$, and particularly preferably satisfy $1 < D_P/D \leq 3$. Thus, the phosphor particles 4 and the large-diameter thermally conductive particles 2 are likely to be present evenly dispersed relative to each other inside the wavelength conversion member 10, so that, upon application of excitation light to the wavelength conversion member 10, heat emitted by the phosphor particles 4 can be easily and efficiently released to the outside. When the average particle diameter $D_P$ of the phosphor particles 4 is greater than the average particle diameter D of the large-diameter thermally conductive particles 2 (1<$D_P$/D), a dense wavelength conversion member 10 can be easily obtained.

The content $V_P$ of the phosphor particles 4 and the content V of the large-diameter thermally conductive particles 2 in the entire wavelength conversion member 10 preferably satisfy 50%≤$V_P$+V≤90%, more preferably satisfy 55%≤$V_P$+V≤85%, and particularly preferably satisfy 60%≤$V_P$+V≤80%. Thus, upon application of excitation light to the wavelength conversion member 10, heat emitted by the phosphor particles 4 can be easily and efficiently released to the outside.

(Wavelength Conversion Member 10)

The wavelength conversion member 10 is preferably a sintered body of the thermally conductive particles 1 and the phosphor particles 4. Thus, the thermally conductive particles 1 and the phosphor particles 4 are bound to each other, which facilitates more effective release of heat emitted by the phosphor particles 4 to the outside. In addition, even when irradiated with high-power excitation light like an LD, the wavelength conversion member is less likely to cause discoloration and melting as compared to a wavelength conversion member in which phosphor particles are dispersed and set in a transparent material, such as a resin matrix or a glass matrix.

The thermal diffusivity of the wavelength conversion member 10 is preferably 2×$10^{-6}$ m²/s or more, more preferably 3×$10^{-6}$ m²/s or more, still more preferably 4×$10^{-6}$ m²/s or more, and particularly preferably 5×$10^{-6}$ m²/s or more. Thus, even when the wavelength conversion member 10 is irradiated with high-intensity excitation light, heat produced in the phosphor particles 4 can be easily and efficiently released to the outside, so that the temperature rise in the wavelength conversion member 10 can be easily reduced. As a result, the decrease in luminous efficiency of the wavelength conversion member 10 due to temperature rise can be easily reduced.

The quantum efficiency of the wavelength conversion member 10 is preferably 20% or more, more preferably 40% or more, still more preferably 60% or more, and particularly preferably 80% or more. If the quantum efficiency is too low, the amount of energy lost to heat becomes large, so that the luminous efficiency of the wavelength conversion member 10 is likely to decrease. In the present invention, the quantum efficiency indicates a value calculated by the following equation and can be measured with an absolute PL quantum yield spectrometer.

Quantum efficiency=[(the number of photons emitted as fluorescence from a sample)/(the number of photons absorbed by the sample)]×100 (%)

The shape of the wavelength conversion member 10 can be, for example, a sheet-like shape (such as a rectangular sheet-like shape or a disc-like shape). The thickness of the wavelength conversion member 10 is preferably 1000 μm or less, more preferably 800 μm or less, and particularly preferably 500 μm or less. If the thickness is too large, light having a desired color tone is difficult to obtain. In addition, the luminous efficiency is likely to decrease. Furthermore, the thickness of the wavelength conversion member 10 is preferably not less than 30 μm, more preferably not less than 50 μm, and particularly preferably not less than 80 μm. If the thickness is too small, the mechanical strength of the wavelength conversion member 10 is likely to decrease.

The porosity of the wavelength conversion member 10 is, relative to the total volume of the wavelength conversion member 10, preferably 10% or less, more preferably 5% or less, and particularly preferably 1% or less. If the porosity is too high, heat produced in the phosphor particles 4 is difficult to release to the outside. In addition, the mechanical strength of the wavelength conversion member 10 is likely to decrease. Furthermore, the light extraction efficiency of the wavelength conversion member 10 is likely to decrease. The lower limit of the porosity is not particularly limited, but is actually not less than 0.01%.

The wavelength conversion member 10 according to the present invention preferably has less color unevenness. Specifically, the sum of a variation in chromaticity Cx and a variation in chromaticity Cy of all light beams of a synthetic light of excitation light having passed through the wavelength conversion member 10 and light converted in wavelength from the excitation light and emitted from the wavelength conversion member is 0.03 or less, preferably 0.025 or less, more preferably 0.02 or less, and particularly preferably 0.015 or less. In the present invention, the sum of a variation in chromaticity Cx and a variation in chromaticity Cy can be determined by the following method (i) or (ii).

(i) Case Where the Size of Excitation Light Entrance Surface of the Wavelength Conversion Member 10 Exceeds 5 mm×5 mm First, the wavelength conversion member 10 is cut out to a size of 5 mm×5 mm and the obtained sheet-like sample is split into quarters of 2.5 mm×2.5 mm, thus making four small pieces. Next, two plates (for example, aluminum plates surface-treated with black alumite) with a 2.4 mm diameter circular through hole open in the center are prepared and one of the above small pieces is sandwiched between the two plates. In doing so, the center of the small piece is aligned with the center of the through hole. Next, excitation light is applied to one side of the small piece, light emitted from the other side of the small piece is taken into an integrating sphere, and all the light beams of the emitted light are measured in terms of chromaticity. In this manner, all the four small pieces are each measured in terms of chromaticity. The variation in chromaticity Cx is considered as a difference ($Cx_{max}$−$Cx_{min}$) between the maximum chromaticity Cx ($Cx_{max}$) in the four small pieces and the minimum chromaticity Cx ($Cx_{min}$) in the four small pieces. On the other hand, the variation in chromaticity Cy is considered as a difference ($Cy_{max}$−$Cy_{min}$) between the maximum chromaticity Cy ($Cy_{max}$) in the four small pieces and the minimum chromaticity Cy ($Cy_{min}$) in the four small pieces. From these values, the sum {($Cx_{max}$−$Cx_{min}$)+($Cy_{max}$−$Cy_{min}$)} of the variation in chromaticity Cx and the variation in chromaticity Cy can be calculated.

(ii) Case Where the Size of Excitation Light Entrance Surface of the Wavelength Conversion Member 10 is 5 mm×5 mm or Less First, the wavelength conversion member 10 is cut out to a size of X mm×X mm and the obtained sheet-like sample is split into quarters of X/2 mm×X/2 mm, thus making four small pieces. In this relation, the length X of each side of the sheet-like sample is preferably selected so that the area of X mm×X mm reaches a maximum. Next, two plates (for example, aluminum plates surface-treated with black alumite) with a (X−0.1) mm diameter through hole open in the center are prepared and one of the above small pieces is centrally aligned with and sandwiched between the two plates. Excitation light is applied to one side of the small piece, light emitted from the other side of the small piece is taken into an integrating sphere, and all the light beams of the emitted light are measured in terms of chromaticity. In this manner, all the four small pieces are each measured in terms of chromaticity. From the obtained data, a variation in chromaticity Cx and a variation in chromaticity Cy are determined. The manner of determining the sum of the variation in chromaticity Cx and the variation in chromaticity Cy is the same as in the above-described method (i).

(Production Method for Wavelength Conversion Member 10)

A method for producing the wavelength conversion member 10 according to the present invention preferably includes the step of mixing and firing thermally conductive particles 1 including two types of thermally conductive particles different in average particle diameter from each other and phosphor particles 4.

The firing is preferably performed by hot pressing. By doing so, a dense sintered body can be easily obtained, so that the thermal conductivity of the wavelength conversion member 10 can be easily increased. The press surface pressure can be appropriately adjusted depending on a desired thickness of the wavelength conversion member 10. For example, the press surface pressure is preferably 1 MPa or more, more preferably 10 MPa or more, and particularly preferably 20 MPa or more. The upper limit of the press surface pressure is not particularly limited, but, for the purpose of preventing breakage of the press mold, it is preferably not more than 100 MPa and particularly preferably not more than 50 MPa.

The maximum temperature during firing is preferably 1300° C. or below, more preferably 1200° C. or below, still more preferably 1100° C. or below, and particularly preferably 1000° C. or below. If the maximum temperature during firing is too high, the phosphor particles 4 are likely to be degraded by heat. If the maximum temperature during firing is too low, a dense sintered body is difficult to obtain. From this viewpoint, the maximum temperature during firing is not lower than 600° C., more preferably not lower than 650° C., and particularly preferably not lower than 700° C.

The pressing time is preferably appropriately adjusted so that a dense sintered boy can be obtained. For example, the pressing time is preferably 0.1 to 300 minutes, more preferably 0.5 to 120 minutes, and particularly preferably 1 to 60 minutes.

The atmosphere during firing is preferably an inert atmosphere, a reductive atmosphere or a vacuum atmosphere. Thus, the degradation of the phosphor particles 4 and the alteration of the thermally conductive particles 1 can be easily reduced. In addition, the deterioration of the press mold due to oxidation can be easily reduced. Specifically, nitrogen or argon is preferably used in an inert atmosphere. From the viewpoint of running cost, nitrogen is particularly preferably used. In a reductive atmosphere, hydrogen is preferably used and a mixed gas of hydrogen and an inert gas is particularly preferably used. The inert gas used herein refers to nitrogen or argon.

A sintered body may be produced by, instead of hot pressing, pressing a mixed powder of the phosphor particles 4, the large-diameter thermally conductive particles 2, and the small-diameter thermally conductive particles 3 in a mold and firing the obtained preform. Alternatively, a sintered body may be produced by containing the preform in a rubber mold and subjecting it to hot isostatic pressing.

(Light-Emitting Device)

FIG. 2 is a schematic cross-sectional view showing a light-emitting device according to one embodiment of the present invention. As shown in FIG. 2, the light-emitting device 50 includes the wavelength conversion member 10 and a light source 6. The light source 6 is disposed so that excitation light $L_0$ enters the wavelength conversion member 10. Excitation light $L_0$ emitted from the light source 6 is converted in wavelength to fluorescence $L_1$ having a longer wavelength than the excitation light $L_0$ by the wavelength conversion member 10. Furthermore, part of the excitation light $L_0$ passes through the wavelength conversion member 10. Therefore, the wavelength conversion member 10 emits synthetic light $L_2$ composed of the excitation light $L_0$ and the fluorescence $L_1$. For example, when the excitation light $L_0$ is a blue light and the fluorescence $L_1$ is a yellow light, a white synthetic light $L_2$ can be provided.

The light source 6 is preferably an LED or an LD. From the perspective of increasing the luminescence intensity of the light-emitting device 50, an LD, which is capable of emitting high-intensity light, is particularly preferably used.

EXAMPLES

Hereinafter, the wavelength conversion member according to the present invention will be described in detail with reference to examples, but the present invention is not limited to the following examples.

Tables 1 and 2 show working examples (Nos. 1 and 3 to 14) of the present invention and a comparative example (No. 2).

TABLE 1

| | | No. 1 | No. 2 | No. 3 | No. 4 | No. 5 | No. 6 | No. 7 |
|---|---|---|---|---|---|---|---|---|
| Phosphor Particles | Type | YAG | YAG | YAG | YAG | YAG | YAG | YAG |
| | Average particle diameter (μm) | 24 | 24 | 24 | 8 | 24 | 24 | 24 |
| | Content (% by volume) | 20 | 20 | 20 | 20 | 20 | 20 | 20 |
| Large-Diameter Thermally Conductive Particles | Type | MgO | MgO | MgO | MgO | MgO | MgO | MgO |
| | Average particle diameter (μm) | 8 | 8 | 47 | 8 | 3 | 12 | 25 |
| | Content (% by volume) | 55 | 80 | 55 | 75 | 55 | 55 | 55 |
| Small-Diameter Thermally Conductive Particles | Type | MgO | — | MgO | MgO | MgO | MgO | MgO |
| | Average particle diameter (μm) | 0.05 | — | 0.05 | 0.05 | 0.05 | 0.05 | 0.05 |
| | Content (% by volume) | 25 | — | 25 | 5 | 25 | 25 | 25 |
| Firing Conditions | Thermal treatment temperature (° C.) | 1000 | 1000 | 1000 | 1000 | 1000 | 1000 | 1000 |
| | Press surface pressure (MPa) | 40 | — | 40 | 40 | 40 | 40 | 40 |
| | Pressing time (min) | 60 | — | 60 | 60 | 60 | 60 | 60 |
| | Thermal treatment atmosphere | $N_2$ | air | $N_2$ | $N_2$ | $N_2$ | $N_2$ | $N_2$ |
| Thermal diffusivity ($\times 10^{-6}$ m$^2$/s) | | 2.7 | 1.0 | 3.7 | 2.5 | 2.0 | 3.2 | 3.5 |
| Quantum efficiency (%) | | 89 | 79 | 80 | 81 | 90 | 88 | 86 |
| Color Unevenness | | good | poor | poor | poor | good | good | good |

TABLE 2

|  |  | No. 8 | No. 9 | No. 10 | No. 11 | No. 12 | No. 13 | No. 14 |
|---|---|---|---|---|---|---|---|---|
| Phosphor Particles | Type | YAG | YAG | YAG | YAG | YAG | YAG | YAG |
|  | Average particle diameter (μm) | 8 | 8 | 8 | 8 | 8 | 8 | 8 |
|  | Content (% by volume) | 20 | 20 | 20 | 20 | 20 | 20 | 20 |
| Large-Diameter Thermally Conductive Particles | Type | MgO | MgO | MgO | MgO | MgO | MgO | MgO |
|  | Average particle diameter (μm) | 3 | 8 | 12 | 25 | 8 | 8 | 8 |
|  | Content (% by volume) | 55 | 55 | 55 | 55 | 35 | 45 | 65 |
| Small-Diameter Thermally Conductive Particles | Type | MgO | MgO | MgO | MgO | MgO | MgO | MgO |
|  | Average particle diameter (μm) | 0.05 | 0.05 | 0.05 | 0.05 | 0.05 | 0.05 | 0.05 |
|  | Content (% by volume) | 25 | 25 | 25 | 25 | 45 | 35 | 15 |
| Firing Conditions | Thermal treatment temperature (° C.) | 1000 | 1000 | 1000 | 1000 | 1000 | 1000 | 1000 |
|  | Press surface pressure (MPa) | 40 | 40 | 40 | 40 | 40 | 40 | 40 |
|  | Pressing time (min) | 60 | 60 | 60 | 60 | 60 | 60 | 60 |
|  | Thermal treatment atmosphere | $N_2$ | $N_2$ | $N_2$ | $N_2$ | $N_2$ | $N_2$ | $N_2$ |
| Thermal diffusivity (× $10^{-6}$ m²/s) | | 3.1 | 3.5 | 3.8 | 4.1 | 2.8 | 3.1 | 3.2 |
| Quantum efficiency (%) | | 90 | 89 | 89 | 87 | 89 | 89 | 85 |
| Color Unevenness | | good | good | good | good | good | good | good |

Each of the working examples (Nos. 1 and 3 to 14) was produced in the following manner. First, phosphor particles, large-diameter thermally conductive particles, and small-diameter thermally conductive particles were mixed to give their contents shown in Tables 1 and 2, thus obtaining a mixture. The materials used were as follows.

(a) Phosphor Particles

YAG phosphor particles ($Y_3Al_5O_{12}$, average particle diameter: 8 μm, 24 μm)

(b) Large-Diameter Thermally Conductive Particles

MgO particles (thermal conductivity: approximately 45 W/m·K, average particle diameter: 3 μm, 8 μm, 12 μm, 25 μm, 47 μm, refractive index (nd): 1.74)

(c) Small-Diameter Thermally Conductive Particles

MgO particles (thermal conductivity: approximately 45 W/m·K, average particle diameter: 0.05 μm, refractive index (nd): 1.74)

The above-described obtained mixture was put into a mold, fired therein by hot pressing under the conditions described in Table 1, and then gradually cooled to ordinary temperature, thus producing a wavelength conversion member as a sintered body.

The comparative example (No. 2) was produced in the following manner. First, phosphor particles and large-diameter thermally conductive particles were mixed to give their contents shown in Table 1, thus obtaining a mixture. The materials used were the same as those in the working example (No. 1).

The above-described obtained mixture was put into a mold, pressed therein at a pressure of 0.45 MPa to form into a compacted body, and then fired under the conditions described in Table 1. After the firing, the mixture was gradually cooled to ordinary temperature, thus producing a wavelength conversion member as a sintered body.

The obtained wavelength conversion members were evaluated in terms of thermal diffusivity, quantum efficiency, and color unevenness in the following manners. The results are shown in Tables 1 and 2.

The thermal diffusivity was measured with a thermal diffusivity measurement system ai-phase manufactured by ai-Phase Co., Ltd. The measurement of the thermal diffusivity for each sample was made eleven times in total under a condition of 105° C. plus/minus 5° C. and a value obtained by averaging the eleven measurement results was employed as the thermal diffusivity of the sample.

The quantum efficiency refers to a value calculated by the following equation and was measured with an absolute PL quantum yield spectrometer (manufactured by Hamamatsu Photonics K.K.).

Quantum efficiency=[ (the number of photons emitted as fluorescence from a sample)/(the number of photons absorbed by the sample)]×100 (%)

Color unevenness was evaluated in the following manner. First, each of the obtained wavelength conversion members was mirror polished to make a sheet-like sample with a thickness of 200 μm. The obtained sheet-like sample was cut out to a size of 5 mm×5 mm and split into quarters of 2.5 mm×2.5 mm, thus making four small pieces. Next, two 1 mm thick, 30 mm×30 mm aluminum plates surface-treated with black alumite and having a 2.4 mm diameter circular through hole open in the center were prepared and one of the above small pieces was sandwiched between the two plates, thus making a measurement sample. Next, excitation light (wavelength: 450 nm) was applied to one side of the measurement sample, light emitted from the other side of the measurement sample was taken into an integrating sphere, and the light was measured in terms of chromaticity. Furthermore, using the remaining three small pieces, measurement samples were made in the same manner and measured in terms of chromaticity. From the obtained data, a maximum value $Cx_{max}$ and a minimum value $Cx_{min}$ of the chromaticity Cx and a maximum value $Cy_{max}$ and a minimum value $Cy_{min}$ of the chromaticity Cy were determined. Then, the sum $\{(Cx_{max}-Cx_{min})+(Cy_{max}-Cy_{min})\}$ of a variation in chromaticity Cx and a variation in chromaticity Cy was calculated. When the obtained sum of variations in chromaticity Cx and chromaticity Cy was 0.03 or less, the sample was evaluated as "good". When the obtained sum of variations in chromaticity Cx and chromaticity Cy was larger than 0.03, the sample was evaluated as "poor".

As is obvious from Tables 1 and 2, the wavelength conversion members of the working examples (Nos. 1 and 3 to 14) exhibited high thermal diffusivities of 2.0×$10^{-6}$ m²/s or more. Furthermore, their quantum efficiencies were as high as 80% or more. On the other hand, the wavelength conversion member of the comparative example (No. 2) exhibited a low thermal diffusivity of 1.0×$10^{-6}$ m²/s and a low quantum efficiency of 79%.

REFERENCE SIGNS LIST 1 thermally conductive particle
2 large-diameter thermally conductive particle 3 small-diameter thermally conductive particle
4 phosphor particle
6 light source
10 wavelength conversion member
50 light-emitting device

The invention claimed is:

1. A wavelength conversion member comprising:
thermally conductive particles and phosphor particles, the thermally conductive particles including two types of thermally conductive particles different in average particle diameter from each other; wherein
the thermally conductive particles include large-diameter thermally conductive particles and small-diameter thermally conductive particles, and
an average particle diameter D of the large-diameter thermally conductive particles and an average particle diameter d of the small-diameter thermally conductive particles satisfy the following conditions (A) and (B):

$$0.5 \ \mu m \leq D \leq 50 \ \mu m \quad (A)$$

and $$0.0001 \leq d/D \leq 0.1 \quad (B).$$

2. The wavelength conversion member according to claim 1, being a sintered body of the thermally conductive particles and the phosphor particles.

3. The wavelength conversion member according to claim 1, wherein the average particle diameter D of the large-diameter thermally conductive particles and an average particle diameter Dp of the phosphor particles satisfy the following condition (C):

$$0.1 \leq D_P/D \leq 10 \quad (C).$$

4. The wavelength conversion member according to claim 1, wherein a content V of the large-diameter thermally conductive particles and a content $V_P$ of the phosphor particles in the wavelength conversion member satisfy the following condition (D):

$$50\% \leq V_P + V \leq 90\% \quad (D).$$

5. The wavelength conversion member according to claim 1, wherein the thermally conductive particles are made of an oxide.

6. The wavelength conversion member according to claim 1, wherein a content $V_P$ of the phosphor particles is 0.01 to 80%.

7. The wavelength conversion member according to claim 1, wherein the wavelength conversion member has a thermal diffusivity of $2 \times 10^{-6}$ m$^2$/s or more.

8. The wavelength conversion member according to claim 1, having a quantum efficiency of 20% or more.

9. A method for producing the wavelength conversion member according to claim 1, the method comprising the step of mixing and firing thermally conductive particles including two types of thermally conductive particles different in average particle diameter from each other and phosphor particles.

10. The method for producing the wavelength conversion member according to claim 9, wherein the firing is performed by hot pressing.

11. The method for producing the wavelength conversion member according to claim 9, wherein a maximum temperature during the firing is 1300° C. or below.

12. The method for producing the wavelength conversion member according to claim 9, wherein the firing is performed in an inert atmosphere, a reductive atmosphere or a vacuum atmosphere.

13. A light-emitting device comprising: the wavelength conversion member according to claim 1; and a light source operable to irradiate the wavelength conversion member with excitation light.

14. The light-emitting device according to claim 13, wherein the light source is a laser diode.

15. A wavelength conversion member comprising:
thermally conductive particles and phosphor particles, the thermally conductive particles including two types of thermally conductive particles different in average particle diameter from each other; wherein
the thermally conductive particles are made of magnesium oxide.

16. A wavelength conversion member capable of converting a wavelength of excitation light emitted from a light source, wherein a sum of a variation in chromaticity Cx and a variation in chromaticity Cy of all light beams of a synthetic light of the excitation light having passed through the wavelength conversion member and light converted in wavelength from the excitation light and emitted from the wavelength conversion member is 0.03 or less.

* * * * *